(12) United States Patent
Obata

(10) Patent No.: US 10,937,927 B2
(45) Date of Patent: Mar. 2, 2021

(54) GROUP III NITRIDE LIGHT-EMITTING ELEMENT AND METHOD FOR PRODUCING THE LIGHT-EMITTING ELEMENT

(71) Applicant: STANLEY ELECTRIC CO., LTD., Tokyo (JP)

(72) Inventor: Toshiyuki Obata, Tokyo (JP)

(73) Assignee: STANLEY ELECTRIC CO., LTD, Tokyo (JP)

( * ) Notice: Subject to any disclaimer, the term of this patent is extended or adjusted under 35 U.S.C. 154(b) by 0 days.

(21) Appl. No.: 16/471,547

(22) PCT Filed: Dec. 15, 2017

(86) PCT No.: PCT/JP2017/045151
§ 371 (c)(1),
(2) Date: Jun. 19, 2019

(87) PCT Pub. No.: WO2018/116989
PCT Pub. Date: Jun. 28, 2018

(65) Prior Publication Data
US 2019/0386177 A1 Dec. 19, 2019

(30) Foreign Application Priority Data
Dec. 20, 2016 (JP) .................................. 2016-246259

(51) Int. Cl.
*H01L 33/24* (2010.01)
*H01L 33/32* (2010.01)
*H01L 33/40* (2010.01)

(52) U.S. Cl.
CPC .............. *H01L 33/24* (2013.01); *H01L 33/32* (2013.01); *H01L 33/405* (2013.01)

(58) Field of Classification Search
CPC ....... H01L 33/24; H01L 33/32; H01L 33/405; H01L 33/0075; H01L 33/20;
(Continued)

(56) References Cited

U.S. PATENT DOCUMENTS 6,323,063 B2 * 11/2001 Krames .................... H01L 33/20
438/116
8,350,284 B2 1/2013 Moriyama et al.
(Continued)

FOREIGN PATENT DOCUMENTS

JP S59004088 A 1/1984
JP 2007201121 A 8/2007
(Continued)

OTHER PUBLICATIONS

International Search Report (ISR) dated Jan. 23, 2018 (and English translation thereof) issued in International Application No. PCT/JP2017/045151.
(Continued)

*Primary Examiner* — Cuong B Nguyen
(74) *Attorney, Agent, or Firm* — Holtz, Holtz & Volek PC

(57) ABSTRACT

A group III nitride semiconductor light-emitting element includes a single crystal substrate and an element layer. The element layer includes an n-type layer, an active layer, and a p-type layer formed on the upper surface of the single crystal substrate in this order, and has a composition represented by the composition formula $Al_XGa_YIn_{1-X-Y}N$ ($0 \leq X \leq 1.0$, $0 \leq Y \leq 1.0$, $0 \leq X+Y \leq 1.0$). The thickness of the single crystal substrate is at least 80 μm. The area of the upper surface of the substrate is larger than the area of the bottom surface of the substrate.

13 Claims, 7 Drawing Sheets

(58) Field of Classification Search
CPC ........... H01L 129/7781; H01L 29/7786; H01L 29/7787; H01L 51/422; H01L 29/8618
See application file for complete search history.

(56) References Cited

U.S. PATENT DOCUMENTS

| | | |
|---|---|---|
| 2009/0200563 A1 | 8/2009 | Goshonoo et al. |
| 2009/0278148 A1* | 11/2009 | Nabekura ............... H01L 33/20 257/98 |
| 2010/0078649 A1 | 4/2010 | Moriyama et al. |
| 2011/0215296 A1 | 9/2011 | Murai et al. |
| 2015/0014702 A1 | 1/2015 | Lee et al. |
| 2016/0240737 A1 | 8/2016 | Ide et al. |

FOREIGN PATENT DOCUMENTS

| | | |
|---|---|---|
| JP | 2009218569 A | 9/2009 |
| JP | 2010087219 A | 4/2010 |
| JP | 2010135746 A | 6/2010 |
| JP | 2015156483 A | 8/2015 |
| JP | 2016149462 A | 8/2016 |
| WO | 2014123092 A1 | 8/2014 |

OTHER PUBLICATIONS

Written Opinion of the International Search Authority dated Jan. 23, 2018 issued in International Application No. PCT/JP2017/045151.
Hirayama, et al., "222-282 nm AlGaN and InAlGaN-based deep-UV LEDs fabricated on high-quality AlN on sapphire", Physica Status Solidi A, vol. 206, No. 6, pp. 1176-1182, Mar. 25, 2009.

* cited by examiner

GROUP III NITRIDE LIGHT-EMITTING ELEMENT AND METHOD FOR PRODUCING THE LIGHT-EMITTING ELEMENT

FIELD OF THE INVENTION

The present invention relates to a novel group III nitride light-emitting element and a method of producing the light-emitting element.

BACKGROUND OF THE INVENTION

Currently, gas light sources using deuterium or mercury are used as a deep ultraviolet light source having an emission wavelength of 365 nm or less. The gas light source has disadvantages such as short, life, harmful, and large size. Therefore, realizing a light-emitting element using a semiconductor which solves the above-mentioned disadvantages and is easy to handle has been waited for.

As semiconductors for realizing such deep ultraviolet emission, light-emitting elements using group III nitride semiconductors, which are represented by the composition formula $Al_qGa_pIn_{1-q-p}N$ ($0 \leq q \leq 1.0$, $0 \leq p \leq 1.0$, $0 \leq q+p \leq 1.0$), have been proposed. Since such a light-emitting element using a group III nitride semiconductor is a direct-transition type semiconductor over the entire wavelength range from 200 to 365 nm, it can function as a deep ultraviolet light-emitting element (see Patent Literature 1 and Non-Patent Literature 1).

Such a deep ultraviolet light-emitting element using a group III nitride semiconductor is generally produced by crystal-growth of an n-type layer, an active layer, and a p-type layer on a substrate made of a single crystal. Crystal growth methods such as metal-organic chemical vapor deposition (MOCVD) method and molecular beam epitaxy (MBE) method may be adopted for manufacturing semiconductor light-emitting elements.

As the single crystal substrate for growth used in the deep ultraviolet light-emitting element, a heterogeneous single crystal substrate material such as sapphire, SiC, Si, or the like, or a homogeneous single crystal substrate such as AlN, GaN, or the like is used. A deep ultraviolet light-emitting element using a group III nitride semiconductor is formed by performing crystal growth of a stacked body forming the light-emitting element on the substrate. In particular, it is known that the use of an AlN single crystal substrate, which is a homogeneous substrate, as a single crystal substrate is desirable from the viewpoint of achieving high output, and long life because the AlN single crystal substrate suppresses the occurrence of dislocations in the deep ultraviolet light-emitting element layer (see Patent Literature 2).

CITATION LIST

Patent Literature

Patent Literature 1: International Publication No. WO2014/123092
Patent Literature 2: Japanese Patent Application Laid-Open No. 2015-156483

Non-Patent Literature

Non-Patent Literature 1: Hidexi Hirayama, Sachic Fujikawa, Norimichi Noguchi, Jun Norimatsu, Takayoshi Takano, Kenji Tsubaki, and Norihiko Kamata, "222-282 nm AlGaN and InAlGaN-based deep-UV LEDs fabricated on high-quality AlN on sapphire", Phys. Status Solidi A 206, No. 6, 1176-1182 (2009)

SUMMARY OF THE INVENTION

Technical Problem

However, the deep ultraviolet light-emitting element using a group III nitride semiconductor has a problem that the light extraction efficiency is low and sufficient light output power cannot be obtained even if the homogeneous substrate or the heterogeneous substrate is used as the substrate for growth.

In order to improve the light extraction efficiency, there have been proposed a method of providing an irregular structure on the light-emitting surface (i.e., the back surface opposite to the surface on which the element layers are stacked), a method of using a reflective electrode on the electrode surface (i.e., the surface on which the element layers are stacked), or the like. However, it cannot be said that the improvement of the light extraction efficiency is sufficient, and the light emission efficiency remains low. Thus, it has been necessary to devise a way to extract light more efficiently.

In addition, the group III nitride light-emitting element that uses the group III nitride semiconductor using the sapphire single crystal substrate, the group III nitride semiconductor single crystal substrate, or the like has a problem that it is hard and brittle, so that chipping, breakage, and cracking occur due to a slight stress, and the yield is lowered accordingly.

In particular, when the light-emitting element is separated from the wafer in which the element layer is formed on the single crystal substrate, such breakage is likely to occur in the cutting process. As a general cutting method, a cutting method such as a diamond scribing method, a laser scribing method, or the like has been adopted. There has been a problem in that chipping, breakage, or cracking of a light-emitting element, tends to occur at the time of such cutting.

Among the above-described cutting methods, the diamond scribing method is a method of cutting a wafer by forming a scribing line on a wafer surface by a diamond cutter and applying a pressure from an upper portion thereof with a roller or the like. In the case where the diamond scribing method is used, although the scribing line can be formed without any problem, it has been found on the basis of the study conducted by the present inventors that breakage occurs in places other than the scribing line at the stage of cutting the wafer, or cracks enter into the inside of the light-emitting element to cause leakage, thereby lowering the yield.

On the other hand, the laser scribing method is a method in which a wafer is scribed or cut by irradiating a surface of the wafer with a laser beam having a wavelength matched with the light absorption of the wafer and evaporating a surface material on the wafer surface by heating the surface of the wafer. In this case, it has been found on the basis of the study conducted by the present inventors that there is a problem in that the cut cross section becomes a light absorption layer by burning with a laser, which leads to a decrease in light output power.

Further, in all the methods, a special device such as a scriber is required, and thus it is also a problem to increase the cost in producing the light-emitting element.

Accordingly, it is an object of the present invention to provide a group III nitride light-emitting element which allows separation of a wafer into light-emitting elements with high precision and high yield by a simple method and improving light extraction efficiency, and a method for producing the light-emitting element.

Solution to Problem

In order to achieve the above-mentioned object, the present inventors have conducted intensive studies. First, attention was paid to the point that physical damage is caused to the light-emitting element by cutting process performed when the wafer having the element layer formed on the single crystal substrate is separated into the light-emitting elements. The use of the cleavage plane of the crystal which can be easily cut was examined in order not to leave the physical damage at the time of element separation. However, among the sapphire substrate and the AlN substrate used as the growth substrate generally used in the group III nitride light-emitting element, it has been found that the sapphire substrate is a substrate that is difficult to cleave. The AlN substrate is a substrate in which both the a-plane and the m-plane are cleavage planes, and therefore, it has been found that cracks and breakage other than a predetermined cleavage plane at the stage of breaking (separating the light-emitting element by pressure or the like from the upper part) after scribing in the diamond scribing method, and breakage occur in the separated light-emitting element. Therefore, when chemical etching of a certain type of single crystal substrate was performed, attention was paid to the point that anisotropic etching was performed. As a result of examination of separation of the light-emitting element by chemical etching, it has been found that separation of the light-emitting element can be easily performed by chemical etching of the back, surface of the wafer in which the element layer is formed on the single crystal substrate. Further, it has been found that since the surface exposed by etching is not perpendicular to the bottom surface of the substrate and an inclined surface maintaining a certain angle can be formed, not only the light absorption loss of the cut surface by the laser scribing method can be reduced, but also the light extraction efficiency can be improved at the same time, whereby the present invention has been completed.

A first aspect of the present invention is a group III nitride semiconductor light-emitting element comprising: a single crystal substrate; and an element layer including an n-type layer, an active layer, and a p-type layer formed on the upper surface of the single crystal substrate in this order having a composition represented by a composition formula $Al_XGa_YIn_{1-X-Y}N$ ($0 \leq X \leq 1.0$, $0 \leq Y \leq 1.0$, $0 \leq X+Y \leq 1.0$), wherein the thickness of the single crystal substrate is at least 80 μm, and the area of the upper surface of the substrate is larger than the area of the bottom surface of the substrate opposite to the upper surface of the substrate on which the element layer is stacked (hereinafter, the upper surface is referred to as "element layer stacked surface").

The group III nitride light-emitting element of the present invention can suitably adopt, the following aspects.

(i) The shape of the element layer stacked surface of the single crystal substrate is any one selected from the group consisting of a triangle, a quadrangle, a hexagon, an octagon, and a dodecagon, and the shape of the bottom surface opposite to the element layer stacked surface of the substrate is any one selected from the group consisting of a circle, a triangle, a quadrangle, and a hexagon.

(ii) The angle formed by the ridge such as formed by the side surface of the substrate and the element layer stacked surface with respect to the element layer stacked surface in the single crystal substrate is in the range of 35° to 75°.

(iii) The single crystal substrate is a group III nitride single crystal substrate, and the element layer stacked surface is a +c-plane of the group III nitride single crystal substrate.

(iv) The emission wavelength of the group III nitride semiconductor light-emitting element is in the range of 200 to 365 nm.

(v) The single crystal substrate is a group III nitride single crystal, substrate, and the element layer stacked surface is a +c-plane of the group III nitride single crystal substrate.

(vi) The group III nitride single crystal substrate is an AlN substrate.

A second aspect of the present invention is a method of producing a group III nitride semiconductor light-emitting element having an element layer on a single crystal substrate, the method including stacking an element layer represented by a composition formula $Al_XGa_YIn_{1-X-Y}N$ ($0 \leq X \leq 1.0$, $0 \leq Y \leq 1.0$, $0 \leq X+Y \leq 1.0$) and having an n-type layer, an active layer, and a p-type layer in this order on an element layer stacked surface of the single crystal substrate, then forming a protective layer having an area smaller than the area of the element layer stacked surface on the bottom surface opposite to the element layer stacked surface of the substrate, and chemically etching the bottom surface opposite to the element, layer stacked surface of the single crystal substrate.

The producing method of the present invention can appropriately adopt the following aspects.

(1) The protective layer is formed such that a center of the protective layer coincides with a center of the light-emitting element.

(2) The group III nitride semiconductor wafer is protected on the element layer side before the chemical etching.

Advantageous Effects of the Invention

The group III nitride light-emitting element of the present invention is characterized in that the area of the element layer stacked surface of the single crystal substrate is larger than the bottom surface opposite to the element layer stacked surface of the substrate. Therefore, since light is extracted from the single crystal substrate side, in consideration of the viewpoint of light, extraction efficiency, the opportunity to satisfy Snell's law is increased and the light emission efficiency is greatly increased. The producing method of the present invention is characterized in that the light-emitting element is separated from the wafer in which the element layer has been formed on the single crystal substrate by only chemical etching or by chemical etching and cleavage. In the producing method of the present invention, since any physical cutting means such as a diamond scribing method or a laser scribing method is not adopted, the light-emitting element is not physically damaged. Therefore, the occurrence of burning, chipping, breakage, and cracking of the light-emitting element can be suppressed, and the light-emitting element can be produced with a nigh yield. In particular, when the shape of the element layer stacked surface in the single crystal substrate of the light-emitting element of the present invention has a complicated shape such as any one selected from the group consisting of a triangle, a quadrangle, a hexagon, an octagon and a dodecagon, and the shape of the bottom surface opposite to the element layer stacked surface of the substrate has a complicated shape such as any one selected from the group consisting of a circle, a triangle, a quadrangle, and a hexagon, element separation from the wafer by physical cutting means such as diamond scribing or laser scribing method is difficult. Thus, the producing method of the present invention can easily achieve element separation.

DESCRIPTION OF EMBODIMENTS (Group III Nitride Semiconductor Light-Emitting Element)

The group III nitride semiconductor light-emitting element of the present invention comprises a single crystal substrate and an element layer. The element layer includes an n-type layer, an active layer, and a p-type layer formed on the upper surface of the single crystal substrate in this order. The n-type layer, the active layer, and the p-type layer have a composition represented by the composition formula $Al_XGa_YIn_{1-X-Y}N$ ($0 \leq X \leq 1.0$, $0 \leq Y \leq 1.0$, $0 \leq X+Y \leq 1.0$). The thickness of the single crystal substrate is at least 80 μm. The area of the upper surface of the substrate is larger than the area of the bottom surface opposite to the element layer stacked surface of the substrate. Hereinafter, the structure of the group III nitride semiconductor light-emitting element of the present invention will be described with reference to the drawings.

Figure 1:
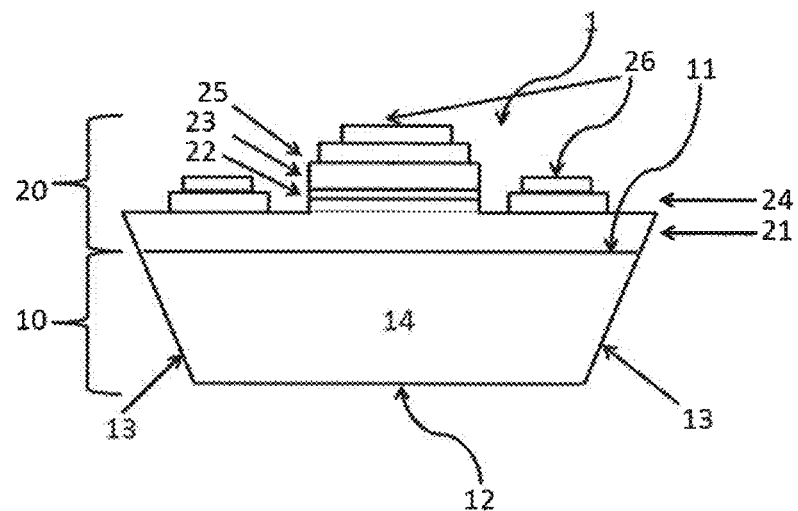
FIG. 1 is a schematic cross-sectional view showing an example of a group III nitride light-emitting element of the present invention.
Figure 2:
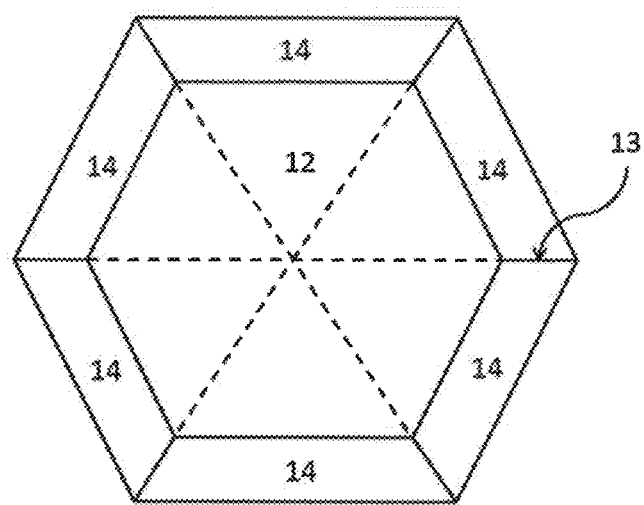
FIG. 2 is a bottom view showing an example of the group III nitride light-emitting element of the present invention.

FIG. 1 is a schematic cross-sectional view of an example of a group III nitride semiconductor element of the present invention. FIG. 2 is a schematic view of the group III nitride semiconductor element of FIG. 1 as seen from the bottom surface of the substrate opposite to the upper surface of the substrate on which the element layer is stacked (hereinafter, the upper surface is referred to as "element layer stacked surface"). A group III nitride stacked body 20 is formed on the +c-plane 11 of the single crystal substrate 10.

FIG. 1 shows a case where the shapes of the element layer stacked surface 11 and the bottom surface 12 opposite to the element layer stacked surface 11 in the single crystal substrate 10 are a regular hexagon (hereinafter, the bottom surface is referred to as "back surface"). As is obvious from FIG. 1, the back surface 12 opposite to the element layer stacked surface is smaller in area than the element layer stacked surface 11. Therefore, the structure of the single crystal substrate 10 in the group III nitride semiconductor element 1 of FIG. 1 is a truncated hexagonal, pyramid as shown in FIG. 2. The single crystal substrate 10 has side surface portions 14 surrounded, by respective sides of the element layer stacked surface 11 and the back surface 12 opposite to the element layer stacked surface and ridge lines 13 connecting the apexes of the element layer stacked surface 11 and the back surface 12 opposite to the element layer stacked surface. In the single crystal substrate 10, at least one of the ridge lines 13 connecting the apexes of the element layer stacked surface 11 and the apexes of the back surface 12 opposite to the element layer stacked surface may have a curved surface. In some cases, a perpendicular line connecting the center of the element layer stacked surface 11 and the center of the back surface 12 opposite to the element layer stacked surface may not be perpendicular to the element layer stacked surface 11 and the back surface 12 opposite to the element layer stacked surface. The group III nitride semiconductor element of the present invention also encompasses such cases. In the schematic diagram of FIG. 2, the single crystal substrate 10 is bilaterally symmetrical, and the line connecting the opposite apexes of the element layer stacked surface 11 and the opposite apexes of the back surface 12 opposite to the element layer stacked surface intersect at the center. However, the apexes of the element layer stacked surface 11 and the apexes of the back surface 12 opposite to the element layer stacked surface may deviate with respect to the center, and the group III nitride semiconductor element of the present invention also encompasses such cases.

Note that the angle between a ridge, such as defined by the side surface 14 of the substrate and the element layer stacked surface 11, and the element layer stacked surface 11 of the single crystal substrate 10, or the angle of the side surface portion 14 relative to the element layer stacked surface 11 of FIG. 1, may vary in inclination depending on the chemical etching in the producing method described be below and the single crystal substrate used. However, in consideration of the effect of improving the light extraction efficiency, the angle between the ridge, such as defined by the side surface 14 of the single crystal substrate 10 and the element layer stacked surface 11, and the element layer stacked surface 11 in the single crystal substrate 10 is preferably in the range of 35° to 75°, preferably in the range of 40° to 10°, and particularly preferably in the range of 45° to 65°. Further, when a group III nitride single crystal substrate, especially an AlN substrate, is used as the single crystal substrate for growth, it is preferable that the angle fall within the range of 53° to 68°.

Figure 3:
FIG. 3 is a SEM photograph showing an example of the group III nitride light-emitting element: of the present invention.

FIG. 3 shows a SEM photograph of the group III nitride semiconductor element 1 actually produced using an AlN substrate as viewed from the back surface 12 opposite to the element layer stacked surface.

Figure 4:
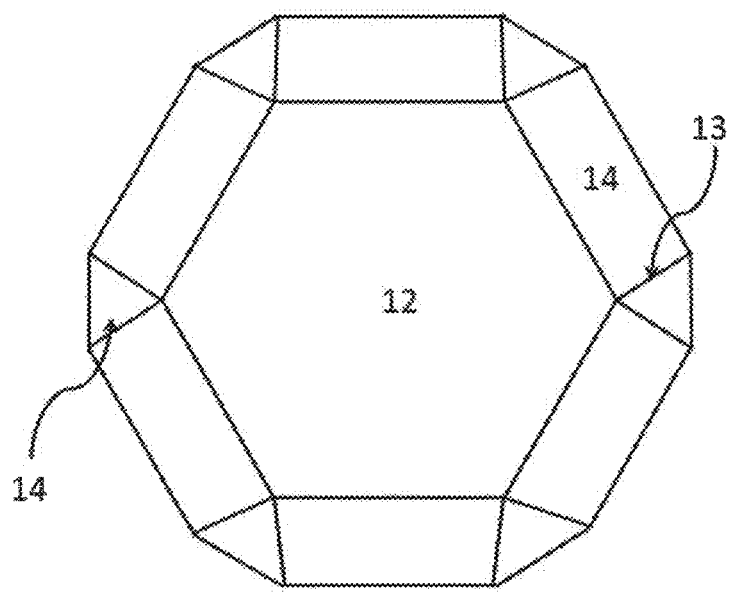
FIG. 4 is a bottom view showing another example of the group III nitride light-emitting element of the present invention.
Figure 5:
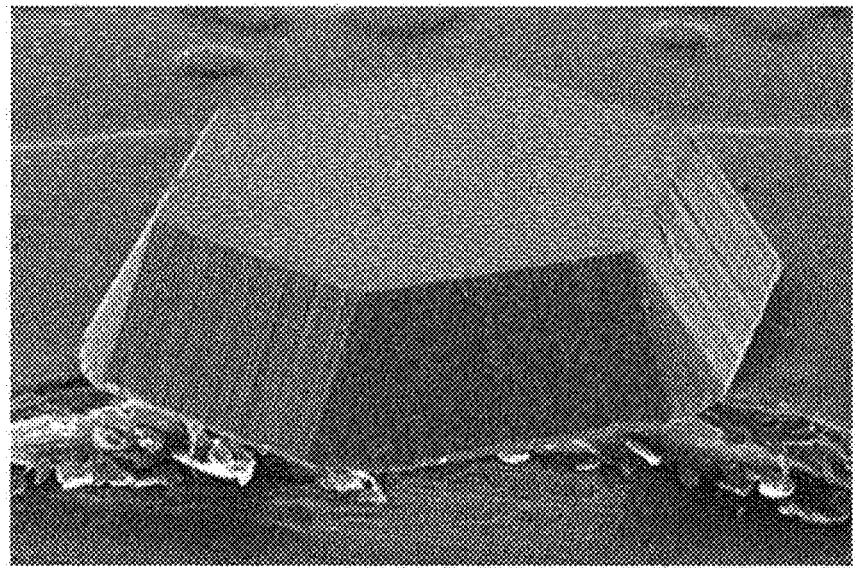
FIG. 5 is a GEM photograph showing another example of the group III nitride light-emitting element of the present invention.
Figure 6:
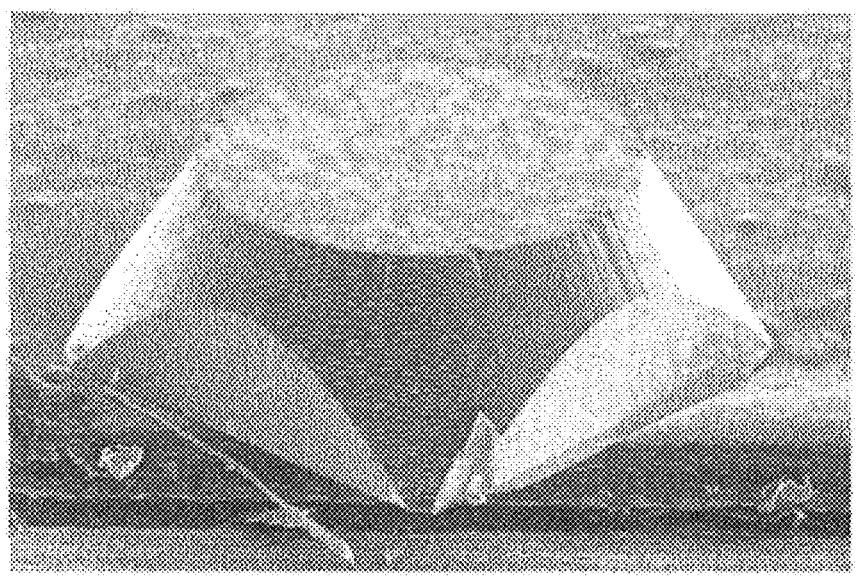
FIG. 6 is a SEM photograph showing another example of the group III nitride light-emitting element of the present invention.

Although FIG. 1 exemplifies an element structure having a truncated hexagonal pyramid, the shapes of the element layer stacked surface 11 and the back surface opposite to the element layer stacked surface 11 are not limited to this, and the element layer stacked surface 11 and the back surface opposite to the element layer stacked surface 11 may have the same shape or different shapes. FIG. 4 shows an example in which the back surface opposite to the element layer stacked surface is hexagonal, while the element layer stacked surface is dodecagonal. FIG. 5 shows a SEM photograph of the group III nitride semiconductor element 1 actually produced using an AlN substrate as viewed from the back surface 12 opposite to the element layer stacked surface, FIG. 6 shows an example in which the back surface opposite to the element layer stacked surface is circular, while the element layer stacked surface is quadrangle.

As is obvious from these figures, the shapes of the element layer stacked surface 11 and the back surface 12 opposite to the element, layer stacked surface are not limited to these shapes, and the element layer stacked surface 11 and the back surface 12 opposite to the element layer stacked surface may have the same shape or different shapes. It is preferable from the viewpoint of improving light extraction efficiency and the productivity, that the shape of the element layer stacked surface 11 be any one selected from the group consisting of a triangle, a quadrangle, a hexagon, an octagon, a dodecagon, and a hexadecagon, that the shape of the back surface 12 opposite to the element layer stacked surface of the substrate be any one selected from the group consisting of a circle, a triangle, a quadrangle, a hexagon, and an octagon, or that the shapes of the element layer stacked surface 11 and the back surface 12 opposite to the element layer stacked surface of the substrate be a circle or a regular polygon. Particularly preferable shapes of the element layer stacked surface 11 and the back surface 12 opposite to the element layer stacked surface of the substrate include the following combinations shown in Table 1.

TABLE 1

| Shape of back surface opposite to element layer stacked surface | Shape of element layer stacked surface |
|---|---|
| Triangle | Triangle |
| Quadrangle | Quadrangle |
| Hexagon | Hexagon |
| Hexagon | Dodecagon |
| Circle | Quadrangle |
| Circle | Hexagon |
| Circle | Circle |

Hereinafter, each layer constituting the group III nitride semiconductor element of the present invention will be described.

(Substrate 10)

The substrate 10 in the group III nitride semiconductor element 1 of the present invention is not particularly limited as long as it is a substrate used in a light-emitting element using a semiconductor, and a known substrate produced by a known method can be used. Specifically, an AlN substrate, a GaN substrate, a sapphire substrate, an SIC substrate, or the like may be mentioned. In particular, from the viewpoint that the group III nitride semiconductor element 1 of the present invention can be produced with a high yield by the producing method described later, it is preferable that the substrate 10 be a substrate allowing back surface processing by chemical etching to be performed. Examples of such a substrate include an AlN substrate and a GaN substrate which are etched by alkali. Examples thereof include sapphire substrates etched by acid. In order to improve the light extraction efficiency of a deep ultraviolet light-emitting element having an emission wavelength of 200 to 350 nm, an AlN substrate and a sapphire substrate are preferable from the viewpoint of light absorption. From the viewpoint of productivity, an AlN substrate having a C-plane as a growth plane is preferable because it can be processed at a lower temperature than a sapphire substrate requiring acid treatment at a temperature close to 300° C.

The higher the transmittance of the substrate 10 with respect to light having a wavelength of 200 to 365 nm, the better. The transmittance is preferably 50% or more, and more preferably 60% or more. The upper limit of the transmittance of the substrate 10 is preferably 100%. The transmittance of the substrate 10 can be adjusted by the material, the thickness of the substrate, the crystallinity, and the impurity content.

The thickness of the substrate 10 is preferably 80 to 500 µm, more preferably 100 to 300 µm, and more preferably 120 to 250 µm, from the viewpoint of improving the light extraction efficiency. By setting the thickness of the substrate 10 in the above-described range, light extraction efficiency is improved and productivity is improved. The thickness of the substrate 10 only needs to satisfy the above-described range after producing the group III nitride semiconductor light-emitting element. The thickness of the substrate may be set to the above-described range by polishing or grinding the lower surface of the substrate after stacking a group III nitride stacked body 20, described later, on the substrate.

(Group III Nitride Stacked Body 20)

The group III nitride stacked body 20 in the group III nitride semiconductor element 1 of the present invention is formed by stacking in the order of the n-type layer 21, the active layer 22, and the p-type layer 23 from the side in contact with the substrate 10. A part of the r-type layer 21 is exposed, and an n-type electrode 24 is formed on a part of the exposed surface. A p-type electrode 25 is formed on the p-type layer.

Each of the n-type layer 21, the active layer 22, and the p-type layer 23 may be a single layer or may have a multilayer configuration. Further, an undoped layer (not shown) may be provided between the n-type layer 21 and the active layer 22, or an undoped layer (not shown) may be provided between the active layer 22 and the p-type layer 23. An undoped layer (not shown), a superlattice layer (not shown), or the like may exist between the substrate 10 and the n-type layer 21. In addition, although it is desirable that each of the layers has a composition represented by the composition formula $Al_qGa_{1-q}N$ ($0 \leq q \leq 1$), the present invention is not limited to this, and the composition may be represented by the composition formula $Al_rIn_{1-r}N$ ($0 \leq r \leq 1$), or may be represented by the composition formula $Al_sGa_tIn_{1-s-t}N$ ($0 \leq s \leq 1$, $0 \leq t \leq 1$). The emission wavelength of the element even with the layer-represented by any of the composition formulas is 200 to 365 nm.

The n-type electrode and the p-type electrode may be any metal material or dielectric as long as they can make ohmic contact with the n-type layer or the p-type layer.

Next, a method of producing the group III nitride semiconductor element of the present invention will be described in detail.

(Method of Producing Group III Nitride Semiconductor Element)

The method of producing a group III nitride light-emitting element of the present invention is characterized by stacking an element layer structure having a composition represented by a composition formula $Al_XGa_YIn_{1-X-Y}N$ ($0 \leq X \leq 1.0$, $0 \leq Y \leq 1.0$, $0 \leq X+Y \leq 1.0$) and having an n-type layer, an active layer, and a p-type layer in this order, on an element layer stacked surface of a single crystal substrate, then forming a protective layer having an area smaller than the area of the element layer stacked surface on the back surface opposite to the element layer stacked surface of the substrate, and then chemically etching the back surface opposite to the element layer stacked surface of the single crystal substrate. When chemical etching is performed on the back surface opposite to the element, layer stacked surface, etching proceeds so as to expose a specific plane orientation, sc that a groove is formed by the etching proceeding along the exposed surface. Element separation can be performed only by etching, and the remaining thickness becomes extremely thin even if small connecting portions between elements are left, so that element separation can be easily performed. Therefore, element separation can be performed without giving physical damage such as chipping, breakage, or cracking to the light-emitting element, and the light-emitting element can be produced with high accuracy and high yield. In addition, since the exposed surface formed at this time is not perpendicular to the bottom surface of the single crystal, substrate, and a polygon or a circle can also be formed, improvement in light extraction efficiency is also possible in one producing process.

According to the producing method of the present invention, it is possible to produce a group III nitride light-emitting element in which the element layer stacked surface and the back surface opposite to the element layer-stacked surface have various shapes as described above. The shapes of the element layer stacked surface and the back surface opposite to the element layer stacked surface are determined firstly by the shape of the protective layer on the hack surface opposite to the element layer stacked surface, and secondly by the shape of the element layer stacked surface, the substrate thickness, and the ratio of the diagonal length of the element layer stacked surface and the diagonal length of the protective layer. The reason why the order of priority exists in determining the shape of the element structure is that the chemical etching proceeds with anisotropy to some extent. For example, FIG. 4 described above is an example in which the back surface opposite to the element layer stacked surface is hexagonal, while the element layer stacked surface is dodecagonal. The difference between FIG. 2 and FIG. 4 is that each side of the hexagon of the protective layer of FIG. 2 is arranged to be parallel to the m-plane of the single crystal substrate, whereas each side of the hexagon of the protective layer of FIG. 4 is arranged to be parallel to the a-plane of the single crystal substrate. This is because the chemical etching has a certain degree of anisotropy, and therefore the inclined surface with respect to the m-plane is more easily exposed preferentially than the inclined surface with respect to the a-plane. Therefore, the back surface 12 opposite to the element layer stacked surface has the same hexagonal shape as in FIG. 2, and two kinds of inclined surfaces are formed. The two inclined surfaces are connected to each other by a ridge line 13. At this time, the ridge line 13 connecting the two inclined surfaces may be a curved surface instead of an accurate intersection line. Further, even when a dodecagon is formed up to an intermediate region of the element: structure by the producing method of FIG. 4, if the substrate thickness is sufficiently thick, or if the ratio of the length of the diagonal line of the protective layer becomes equal or substantially equal to the length of the diagonal line of the surface on which the element is stacked, it is obvious that the surface on which the final element layer is stacked becomes a hexagon, FIG. 6 shows an example in which the shape of the protective layer 50 is a circle and the shape of the surface on which the element layer is stacked is a quadrangle. In general, as shown in FIG. 2 and FIG. 4, the chemical etching proceeds anisotropically so as to expose a specific plane, but the result of FIG. 6 is not limitative. In FIG. 6, although a quadrangle is selected as the shape of the surface on which the element layers are stacked, if a polygon such as a hexagon is selected and the thickness of the substrate and the ratio of the length of the diagonal lone of the protective layer to the length of the diagonal line of the surface on which the element layer is stacked are appropriately designed, the shape of the surface on which the element layer is stacked can be made a hexagon, and other polygons, a circle, or the like can also be formed.

As described above, the shape of the element structure can be determined firstly by the shape of the protective layer, and secondly by the shape of the surface on which the element layer is stacked, the substrate thickness, and the ratio of the diagonal length or the protective layer to the diagonal length of the surface on which the element layer is stacked. Hereinafter, the producing method of the present invention will be described with reference to a producing flow chart.

Figure 7:
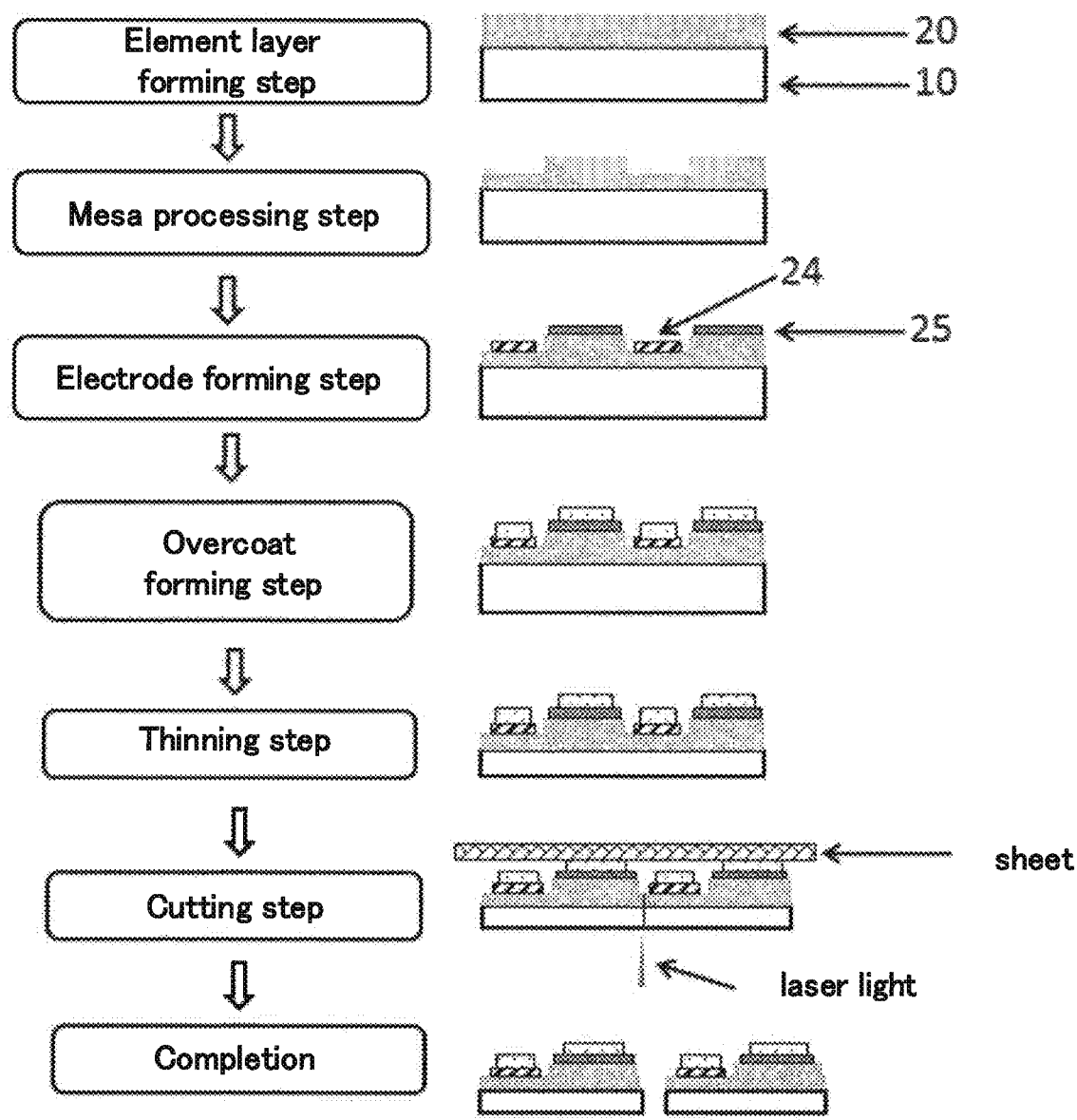
FIG. 7 is a flow chart showing an example of a conventional method of producing a group III nitride light-emitting element.

FIG. 7 is a general producing flow diagram of a group III nitride semiconductor element. In a general producing flow, the element layer 20 is stacked in the order of an n-type layer, an active layer, and a p-type layer on the group III nitride single crystal substrate 10 (element layer forming step), and a mesa structure is formed by etching a part of the n-type layer of the element layer (mesa processing step). Next, an n-electrode 24 and a p-electrode 25 are formed (electrode forming step), an overcoat, layer for protecting the n-electrode 24 and the p-electrode 25 is formed (overcoat forming step), and thereafter, the surface of the group III nitride single crystal substrate on the opposite side to the surface on which the element layer is formed is ground to be thinned (thinning step), whereby a group III nitride semiconductor wafer is produced. The produced semiconductor wafer is in a state in which a plurality of elements are connected, and is placed on the sheet with directing the element layer side downward. Then, the semiconductor wafer is cut from the single crystal substrate side by laser scribing or the like to perform element separation.

Figure 8:
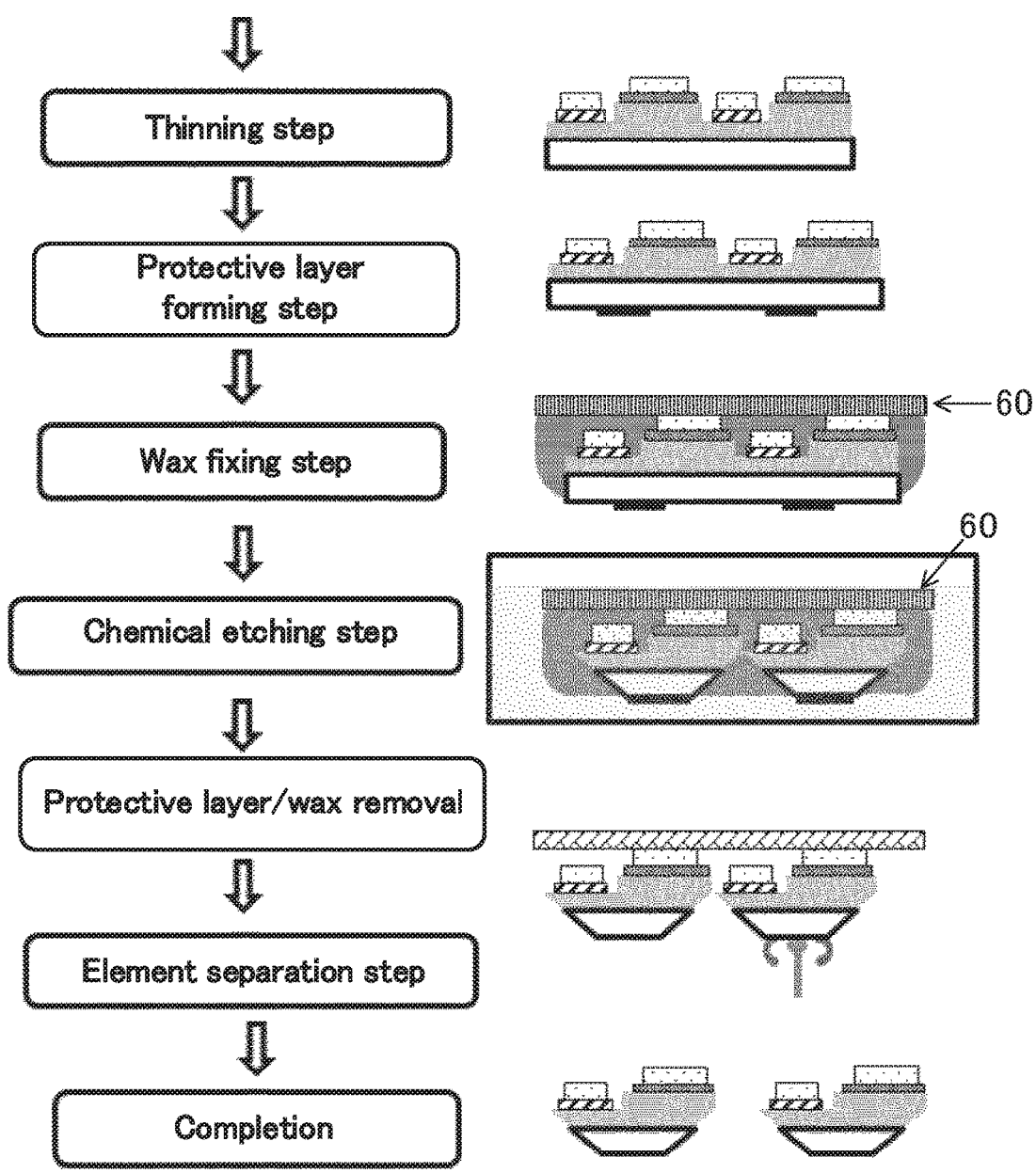
FIG. 8 is a flow chart showing an example of a method of producing a group III nitride light-emitting element of the present invention.

On the other hand, in the method of producing the group III nitride light-emitting element of the present invention, as shown in FIG. 8 as a preferable producing flow, when the group ITT nitride semiconductor wafer on which the thinning step has been performed is separated into the group III nitride semiconductor elements, chemical etching of the back surface opposite to the element layer stacked surface of the single crystal substrate in the group III nitride semiconductor wafer is performed. When the back surface opposite to the element layer stacked surface is chemically etched, etching proceeds in accordance with the shape of the protective layer formed on the back surface opposite to the element layer stacked surface, and thus an etching groove is formed along the outer periphery of the protective layer. Therefore, element separation can be easily performed along the formed etching groove. Therefore, element separation can be performed without giving physical damage such as chipping, breakage, or cracking to the light-emitting element, and the light-emitting element can be produced with high accuracy and high yield. Before performing the chemical etching, it is preferable to hold the element layer side of the group III nitride semiconductor wafer on a supporting substrate and fix it with a fixing agent such as a wax in order to fix and protect the element layer 20. Hereinafter, each step will be described in detail.

(Element Layer Forming Step)

The element layer forming step in the production of the group III nitride semiconductor element of the present invention is a step of forming the element layer 20 on the single crystal substrate 10. The single crystal substrate 10 described above is not particularly limited as long as it is a substrate used for a light-emitting element using a semiconductor, and a known substrate produced by a known method can be used. Specifically, an AlN substrate, a GaN substrate, a sapphire substrate, an SiC substrate, an Si substrate, or the like may be mentioned. Among them, from the viewpoint that the group III nitride semiconductor element 1 of the present invention can be produced with a high yield, it is preferable that the substrate 10 be a substrate which can be subjected to back surface processing by chemical etching. As such a substrate, an AlN substrate and a GaN substrate etched by alkali, a sapphire substrate etched by phosphoric acid, or the like may be mentioned. A sapphire substrate or an AlN substrate having a light-transmitting property with respect to light of 200 to 365 nm is preferable. Further, from the viewpoint of crystallinity of the element layer 20 on the single crystal substrate 10, a group III nitride single crystal substrate which is the homogeneous substrate is preferable. Also from the viewpoint of productivity, an AlN substrate which is a group III nitride single crystal substrate capable of wet etching at a lower temperature than a sapphire substrate which requires wet etching under a high temperature environment, of about 300° C. is preferable. At this time, since the element layer 20 is etched with an alkali from the −C-plane of the group III nitride single crystal substrate, the AlN substrate with the C-plane as the growth plane is the most preferred.

The element layer 20 is formed on the single crystal substrate 10. The element layer 20 can be produced by stacking an n-type layer, an active layer, and a p-type layer in this order from the side in contact with the group III nitride single crystal substrate 10.

Each of the n-type layer, the active layer, and the p-type layer may be a single layer or may have a multilayer configuration. Further, an undoped layer may be provided between the n-type layer and the light-emitting layer, or an undoped layer may be provided between the light-emitting layer and the p-type layer. An undoped layer, a superlattice layer, or the like may exist between the substrate 10 and the n-type layer. In addition, although it is desirable that any of the layers has a composition represented by a composition formula $Al_qGa_{1-q}N$ (0≤q≤1), the present invention is not limited to this, and composition of any of the layers nay be represented by a composition formula $Al_rIn_{1-r}N$ (0≤r≤1), or may be represented by a composition formula $Al_sGa_tIn_{1-s-t}N$ (0≤s≤1, 0≤t≤1, 0≤s+t≤1). The emission wavelength of the element even with the layer represented by any of the composition formulas is 200 to 365 nm.

In the producing method, the element layer 20 may be produced by a known producing method, for example, a metal-organic chemical vapor deposition (MOCVD) method. Specifically, a group III source gas, for example, an organometallic gas such as trimethylaluminum or trimethylgallium, and a nitrogen source gas, for example, a source gas such as ammonia gas are supplied onto the single crystal substrate 10 by using a commercially available apparatus, whereby an n-type layer, a light-emitting layer, and a p-type layer can be sequentially stacked on the single crystal substrate 10. It can also be produced by methods other than the MOCVD method.

(Mesa Processing Step)

By a mesa processing step, a mesa structure is introduced into the group III nitride semiconductor wafer, on which the element layer 20 has been formed in the above element layer forming step.

The n-electrode 24 is formed on the exposed surface of the n-type layer exposed by the mesa processing step. The mesa structure is formed by means of etching or the like. By forming the exposed surface of the n-type layer by the mesa processing step, the stacked semiconductor layer remains in a plateau shape, and a mesa structure is formed. An n-electrode on the n-type layer is formed in the low-lying portion of the mesa structure along the lower edge of the mesa structure. The n-electrode may be formed at a distance from the bottom portion of the mesa structure, or may have a structure in which the n-type layer is exposed between the mesa structure and the n-electrode 24.

As a method of etching for forming the mesa structure, for example, dry etching such as reactive ion etching or inductively-coupled plasma etching may be mentioned. After forming the exposed surface of the n-type layer, the exposed surface is preferably surface treated with an acid or alkali solution to remove etching damage. Thereafter, the n-electrode 24 having ohmic properties is formed on the exposed surface of the n-type layer.

(Electrode Forming Step)

The electrode forming step is a step of forming the n-electrode 24 and the p-electrode 25 on the group III nitride semiconductor wafer into which the mesa structure has been introduced in the above-mentioned mesa processing step.

Patterning of the n-electrode can be performed using a lift-off method. In the lift-off method, a photoresist is applied to a surface on which an electrode is to be formed, irradiated with ultraviolet rays by a UV exposure machine equipped with a photomask, immersed in a developing solution to dissolve the exposed photoresist to form a desired pattern, and then an electrode metal is deposited on the patterned photoresist, and the photoresist is dissolved by a stripping solution to form a pattern of the electrode metal. As another patterning method, there is a method in which an electrode metal film is formed in an electrode forming surface, a photoresist is applied, then the photoresist is patterned through exposure and development processes, the electrode metal is patterned by dry etching or wet etching using the photoresist as a mask, and the photoresist is dissolved by a stripping solution. The lift-off method is preferable because the process is relatively simple.

Examples of the method of depositing the n-electrode include vacuum deposition, sputtering, chemical vapor deposition, and the like. In particular, when a metal, is used for the electrode, vacuum deposition is preferable because impurities in the metal can be eliminated. When an oxide is used for the electrode, sputtering is preferable from the viewpoint of composition control. The material used for the n-electrode can be selected from known materials. Examples thereof include Ti, Al, Rh, Cr, In, Ni, Ft, Ta, W, Mo, V, and Au. Among these, Ti, Al, Rh, Cr, Ni, Ft, Ta, W, Mo, V and Au are preferable. In particular, a combination of Ti, Al, V, and Au is preferable because ohmic properties and reflectivity can be improved. The n-electrode may be a single layer, or a multilayer structure, containing an alloy or oxide of these metals. In order to improve the contact property with the n-type layer, it is preferable that after the n-electrode material is deposited, a heat treatment at a temperature of 400° C. to 1000° C. for 5 seconds to 3 minutes is performed. With respect to the temperature and time of the heat treatment, optimum conditions can be appropriately selected according to the material of the n-electrode and the thickness of the layer.

The patterning of the p-electrode is preferably performed by using a lift-off method, similarly to the patterning of the n-electrode. The metal material used for the p-electrode may be selected from known materials. Examples of the material include Ni, Cr, Au, Mg, Zn, Pd, Al, In, Sn, and Pt. Among them, a combination of Ni and Au, or Pd, Pt, and Au is preferable. The p-electrode may be a single layer, or a multilayer structure, containing an alloy or oxide of these metals.

As a method of depositing the p-electrode, for example, vacuum deposition, sputtering, chemical vapor deposition, or the like may be mentioned as in the method of forming the n-electrode. In particular, when a metal is used for the electrode, vacuum deposition is preferable because impurities in the electrode metal can be eliminated. When an oxide is used for the electrode, sputtering is preferable from the viewpoint of composition control. In order to improve the contact, property with the p-type contact layer, heat treatment is preferably performed at a temperature of 200° C. to 800° C. for 5 seconds to 60 minutes after depositing the p-electrode material. With respect to the temperature and time of the heat treatment, optimum conditions can be appropriately selected in accordance with the material of the p-electrode and the thickness of the layer.

(Overcoat Forming Step)

In the producing method of the present invention, an overcoat layer may be formed on each electrode of the group III nitride semiconductor wafer on which the element layer 20, the n-electrode 24, and the p-electrode 25 are formed, for the purpose of protecting the electrode material.

The patterning of the overcoat layer 26 is preferably performed using a lift-off method as in the case of the patterning of the n-electrode. The metal material used for the overcoat layer can be selected from known materials. Examples include Ti, Ni, Cr, Au, Pd, Ta, W, Mo, Rh, and Pt. Among them, a combination of Ti, Ni, Au, W, Mo, and Pt is preferable. The overcoat layer 26 may be a single layer, or a multilayer structure, containing an alloy or oxide of these metals.

A passivation layer may be formed to protect the respective electrodes and the mesa structure. In the patterning of the passivation layer, similarly to the patterning of the n-electrode, a lift-off method may be used, or after, the passivation layer is formed on the entire surface of the group III nitride semiconductor wafer, patterning is performed by using a lift-off method, and dry etching such as reactive ion etching or inductively-coupled plasma etching is performed. Alternatively, a desired pattern may be formed by chemical etching such as acid or alkali.

The material used for the passivation layer is preferably an insulator, and can be selected from known materials. For example, oxides, fluorides, nitrides, and the like made of metal materials such as Si, Ti, Al, Ga, Zr, Hf, Ta, Mg, Zn, Ca, and Ba may be mentioned. Among them, an oxide made of Si, Al, Ga, or a nitride made of Al is preferable from the viewpoint of ultraviolet transmittance and productivity, but the present invention is not limited thereto. The protective layer may have a multilayer structure including a reflective material as long as the n-electrode and the p-electrode are insulated from each other. As a reflective material, Al is generally used as a metal material with respect to ultraviolet rays, but this is not limitative.

(Thinning Step)

The thickness of the single crystal substrate 10 in the group III nitride semiconductor element obtained by the producing method of the present invention is preferably 80 to 500 µm, more preferably 100 to 300 µm, and more preferably 120 to 250 µm from the viewpoint of improving the light extraction efficiency. By setting the thickness of the substrate 10 in the above-described range, light extraction efficiency is improved and productivity is improved. The thickness of the substrate 10 only needs to satisfy the above range after producing the group III nitride semiconductor light-emitting element, and the thickness of the substrate may be set to the above-described range by polishing or grinding the lower surface of the substrate after stacking the group III nitride stacked body 20 described later on the substrate.

(Protective Layer Forming Step)

Next, a predetermined resist pattern is formed by photolithography on the surface of the polished group III nitride semiconductor wafer on the side where the group III nitride stacked body 20 is not stacked (hereinafter, the back surface). Thereafter, a protective layer 50 which has been subjected to a predetermined patterning by an evaporation method, a sputtering film forming method, or the like is formed on the back surface of the semiconductor wafer 2. The protective layer 50 may be formed on the entire back surface of the semiconductor wafer 2 and then patterned by lift-off. As the type of the protective layer, any material may be used as long as it satisfies the three conditions of high adhesion to the single crystal substrate, resistance to the chemical etching process, and high corrosiveness or peelability to the protective film removing process. Further, it is preferable to use a material having a high selectivity with respect to the single crystal substrate 10 in dry etching. For example, Ti, Cr, Ni, Pd, W, Mo, Pt, Au, or the like can be used as a metal material, and $SiO_2$, $TiO_x$, $Al_2O_3$, ITO, ZTO, AZO, or the like can be used as a dielectric material, and Si, Ge, or the like can be used as a semiconducting material, but they are not limitative. The protective layer may be a single layer, or a multilayer structure, containing an alley or oxide of these metals.

The shape of the protective layer 50 is preferably patterned according to the anisotropy of the chemical etching. For example, if the r-plane is exposed after the chemical etching, it is preferable to have a regular triangle pattern or a regular hexagonal pattern, and it is preferable that each side of the shape be a line of intersection between the r-planes. In addition, it is desirable that the protective layer 50 has a shape similar to the shape of the respective group III nitride semiconductor elements 1 from the top view, but this is not limitative. In addition, it may be a complex shape in which the r-plane and an index plane other than the r-plane are combined (FIGS. 4 and 6). However, there may be some variation in the coincidence with the crystal plane from the viewpoint of productivity.

Further, it is desirable that the center of each group III nitride semiconductor element 1 in the semiconductor wafer 2 coincide with the center of the protective layer 50 at the position where the protective layer 50 is disposed. However, there may be some variation in the coincidence with the crystal plane from the viewpoint of productivity. Depending on the method of chemical etching, the center of the protective layer 50 may be largely deviated from the center of each group III nitride semiconductor element 1.

In the producing method of the present invention, it is necessary that the area of the protective layer 50 on the back surface 12 opposite to the element layer stacked surface is smaller than the area of the element layer stacked surface.

Figure 9:
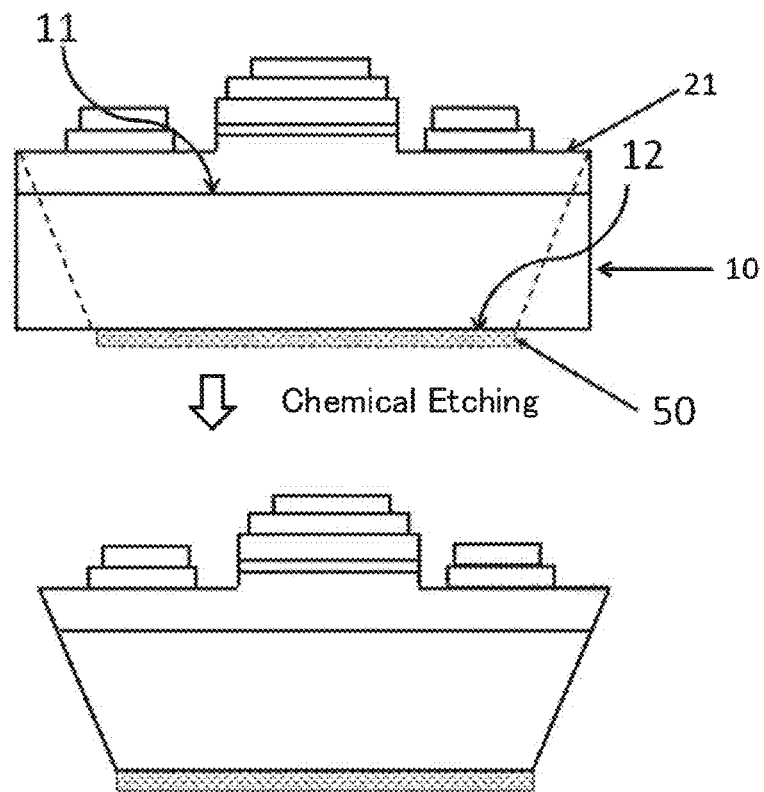
FIG. 9 is a view showing changes before and after chemical etching of the group III nitride light-emitting element shown in FIG. 1.

FIG. 9 is a diagram showing changes in a schematic cross-sectional view before and after chemical etching of the group III nitride light-emitting element shown in FIG. 1. In FIG. 9, the protective layer 50 is formed on the back surface 12 opposite to the element layer stacked surface. When chemical etching is performed in this state, the portion of the back surface 12 opposite to the element layer stack surface which is covered with the protective layer 50 is not etched. Etching is performed from the end of the protective layer 50 to the end of the n-type layer 21 stacked on the single crystal substrate 10, that is, along a broken line in the figure. Therefore, according to the producing method of the present invention, it is possible to produce the group III nitride light-emitting element in which the area of the element layer stacked surface is larger than the area of the back surface opposite to the element layer stacked surface of the substrate.

Figure 10:
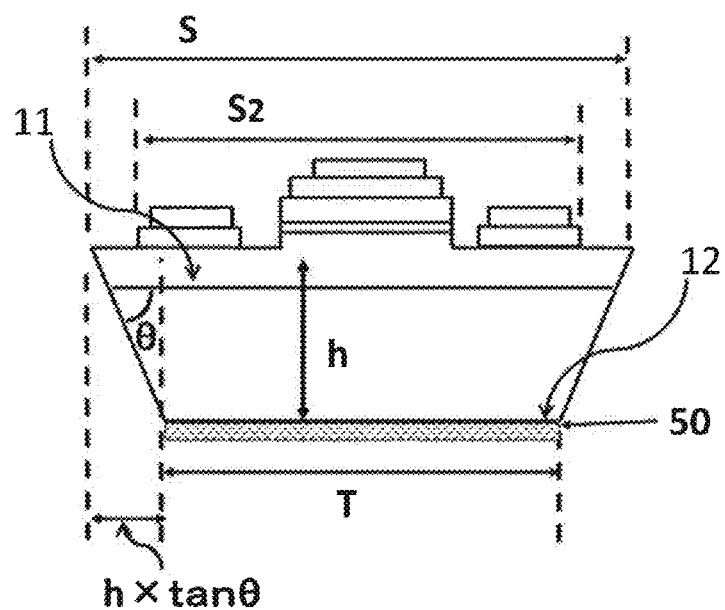
FIG. 10 is a diagram for defining the size of a protective layer 50.

Therefore, the area of the protective layer 50 for protecting the back surface 12 opposite to the element, layer stacked surface needs to be smaller than the area of the element layer stacked surface 11. Specifically, as shown in FIG. 10, the protective layer 50 only needs to be formed so that the maximum length T of the protective layer 50 has a relationship S>T with respect to the maximum length S when the group III nitride semiconductor element 1 is viewed from above. Note that the maximum length T of the protective layer 50 and the maximum length S when the group III nitride semiconductor element 1 is viewed from above are the longest length of diagonal lines when the shapes of the element stacked surface 11 and the back surface 12 opposite to the element stacked surface are polygonal, and the diameter is the longest when the shape is a circle.

In addition, the chemical etching proceeds so that the angle (θ in FIG. 10) between the ridge, such as defined by the side surface 14 of the substrate and the element layer stacked surface 11, and the element layer stacked surface 11 in the single crystal substrate 10 is in a range of 35° to 75°. If the protective layer 50 is too small (i.e., the length of T in FIG. 10 is too small with respect to the element layer stacked surface 11), the electrode of the element layer may also be etched. Therefore, in order to produce a desired group III nitride light-emitting element with high dimensional accuracy, it is necessary to take into consideration the erosion due to the chemical etching of the element structure such as the electrode due to the progress of the chemical etching. Therefore, when the maximum length of the element functional portion in the group-III nitride light-emitting element is $S_2$, it is preferable to control the protective layer 50 so that the maximum length T and the maximum length S satisfy the relation of $T>S_2-2\times(h\times\tan\theta)$. Here, h indicates the thickness from the back surface of the substrate to the n-type layer exposed for forming the n-electrode. Note that the maximum length $S_2$ of the element functional portion is the maximum length of the distance between the ends of the n-electrode formed on the n-type layer in the element shown in FIG. 10, and is indicated as the minimum range required for driving the light-emitting element.

(Dry Etching Step)

The group III nitride semiconductor wafer on which the protective layer has been formed in the above-described protective film forming step is preferably subjected to dry etching as a pretreatment for the subsequent chemical etching. This is because when dry etching is performed, the subsequent chemical etching can be performed in a shorter time and stably. Therefore, in this dry etching step, it is not necessary to dry etch it into a depth sufficient to form a mesa shape, and it is sufficient to cause plasma damage to the surface by dry etching. The main purpose of the dry etching is to cause plasma damage, and therefore any method may be used. The gas used may be any chlorine-based gas or any fluorine-based gas.

(Wax Fixing Step)

In order to fix and protect the element layer 20, the group III nitride semiconductor wafer on which the protective layer has been formed in the protective layer forming step and the dry etching step is fixed with wax or the like by holding the element layer side of the group III nitride semiconductor wafer on a supporting substrate in the wax fixing step. The supporting substrate is a substrate different from the single crystal substrate for growth and can be used without limitation as long as it is resistant to chemicals used in the chemical etching step, the protective layer removal step, and the wax removal, which will be described later. Specific examples of such a supporting substrate include a glass substrate, a sapphire substrate, and a Si substrate.

Further, it is preferable to fill the space between the group III nitride single crystal substrate 10 and the supporting substrate with a fixing agent in order to prevent the group III nitride semiconductor wafer from being detached from the supporting substrate during the chemical etching and to protect the element layer 20 and the electrode from the chemicals used for the chemical etching. As the fixing agent, it is preferable to use a wax having a high chemical resistance, but this is not limitative, and if the chemical resistance is high, it may be a grease, a resist, an UV tape, or a material such as spin glass. However, in the case where the element layer 20 and the electrode are not reactive to the chemicals used, this step is not necessarily required, and the wafer may or may not be fixed to the supporting substrate.

(Chemical Etching Step)

The group III nitride semiconductor wafer fixed on the supporting substrate in the wax fixing step is chemically etched from the back surface opposite to the element layer stacked surface of the single crystal substrate. The chemical used for the chemical etching in the producing method of the present invention is not particularly limited as long as the chemical etching can be performed on the back surface opposite to the element layer stacked surface of the single crystal substrate, and may be appropriately determined in accordance with the type of the single crystal substrate 10. Specific examples of the chemicals used for the chemical etching include, but are not limited to, an alkaline solution such as KOH, NaOH, or TMAH, and an acidic solution such as phosphoric acid or pyrophosphate. The etching method may be not only a simple immersion method but also an electrochemical method or an etching method with light irradiation.

In addition, the element can be separated depending on the etching depth in the chemical etching step. Alternatively, etching may be performed to such an extent that a groove is formed along the outer periphery of the protective layer, and element separation may be performed in an element separation step to be described later. The groove depth is preferably at least h/4 with respect to the thickness h from the back surface of the substrate to the n-type layer exposed for forming the n-electrode. More preferably, the groove depth is at least h/2.

The etching environment temperature may be appropriately determined depending on the etchant used and the etching rate. After the etching, rinsing is performed with ultrapure water. The rinsing time may be appropriately determined according to circumstances.

(Protective Layer/Wax Removal)

The protective layer, and the wax are removed from the group III nitride semiconductor wafer in which the back surface opposite to the element layer stacked surface of the single crystal substrate is etched in the above-described chemical etching step. Then the group III nitride semiconductor wafer is removed from the supporting substrate. As a method of removing the protective layer, there is no particular limitation as long as the protective layer can be removed, and not only a simple immersion method but also an electrochemical method, an etching method with light irradiation, or the like can be adopted.

The chemicals used in the removing method by the immersion method may be selected depending on the material of the protective layer, the single crystal substrate, and the wax, and the chemical which can remove the protective layer and has no corrosion/reactivity to the single crystal substrate and the wax or has small corrosion/reactivity may be selected. Specific examples of the chemical used for removing the protective layer include an acidic solution of HCl, HF, or the like.

Next, the semiconductor wafer 2 or the group III nitride semiconductor element 1 is peeled off from the supporting substrate 60. The peeling method differs depending on the fixing method of the supporting substrate 60 and the semiconductor wafer 2. For example, in the case of wax or grease, the adhesive material is melted and peeled by immersing them in an appropriate organic solvent, or by applying heat. For example, in the case of a UV tape, the UV tape is peeled off by simple peeling. For example, in the case of spin-on glass, it is peeled off by immersion in an HF solution and etching. Any method may be used, but damage should not be given to the semiconductor wafer 2 or the group III nitride semiconductor element 1. The term "damage" herein refers to chipping or breakage of a wafer or an element, or corrosion or peeling of an electrode layer.

(Element Separation Step of Group III Nitride Semiconductor Element 1 from Processed Semiconductor Wafer 2)

Next, a method of separating the group III nitride semiconductor element 1 from the semiconductor wafer 2 will be described. In the case where element separation is performed by a first chemical solution in the back surface etching step, element separation is completely performed by the peeling step from the supporting substrate 60, and therefore, the subject step here is limited to the case where only element separation grooves are formed in the back surface etching step.

The processed semiconductor wafer 2 peeled by the peeling step from the supporting substrate 60 is attached to a tackiness sheet. Further, in order to protect the group III nitride semiconductor element 1, a tackiness sheet is stacked thereon. The tackiness sheet used herein may be any sheet as long as the tackiness sheet has low adhesion and the tackiness agent does not adhere to the group III nitride semiconductor element 1.

Next, the semiconductor wafer 2 attached to the tackiness sheet is fixed to a stage. Finally, the semiconductor wafer 2 below the tackiness sheet is pressed and spread by a roller, and cleavage is performed. The cleavage method is not limited to the use of a roller and may be a blade pressing method.

EXAMPLES

Hereinafter, the present invention will be described in detail by examples and comparative examples, but the present invention is not limited to the following examples.

A SMS-500 produced by SphereOptics GmbH was used for measuring emission wavelengths and light output powers.

Example 1

(Element Layer Forming Step to Overcoat Forming Step)

A group III nitride light-emitting element having the multi layer structure shown in FIG. 1 was produced. First, a group-III nitride stacked body 20 was deposited on a +c-plane AlN single crystal substrate 10 having a diameter φ of 25 mm and a thickness of 600 μm by the MOCVD method, adjusting the flow ratio of trimethylaluminum and trimethylgallium so that the emission wavelength became 265 nm. In a part of the group-III nitride stacked body 20, n-type AlGaN was exposed and an n-type electrode 30 was bonded thereto. The surface of the group III nitride stacked body on the side not bonded to the AlN single crystal substrate was a p-type group III nitride semiconductor, and this surface was bonded to the p-type electrode 40. Next, an overcoat layer 26 was bonded onto the n-type electrode 30 and the p-type electrode 40, thereby producing the group III nitride stacked body 20. With respect to the shape and size, the surface shape of the element layer stacked surface 11 is a regular hexagon, and the diagonal line having the largest length: S is 693 μm and the area is 311770 μm². The area of the active layers 20 is 92000 μm². At this time, each side of the regular hexagon was disposed in accordance with the m-plane of the AlN substrate.

(Thinning Step)

Next, the back surface of the AlN single crystal substrate 10 in the group III nitride multilayer body 20 was thinned by mechanical polishing to complete the semiconductor wafer 2. The remaining thickness h of the substrate at this time was 140 μm.

Next, the polished back surface was cleaned. To protect, the group III nitride stacked body 20 during cleaning, a resist was applied to the entire front surface of the group III nitride stacked body 20 and baked. Thereafter, the polished back surface was scrubbed with ultrapure water and melamine foam, and then the semiconductor wafer 2 was immersed in hydrochloric acid having a concentration of 36%. The ambient temperature at which the step was performed was room temperature and immersion was performed for 15 minutes.

(Protective Layer Forming Step to Wax Fixing Step)

Next, a regular hexagonal pattern was produced on the polished back surface by a photolithography method. Thereafter, 10/200/20 nm of Ti/Ni/Au was deposited by a vacuum deposition method to form a protective film 50. With respect to the shape and size, the shape of the protective film 50 is a regular hexagonal, the diagonal line having the largest length: T is 519 μm and the area is 175980 μm². The center of the chip and the center of the protective film were coaxial with each other, and the diagonal line of the protective film 50 is coaxial with the diagonal line of the element.

(Dry Etching Step)

Next, the back surface of the AlN single crystal substrate 10 was subjected to cry etching by reactive ion etching. For the dry etching, an ICP etching system was used. Dry etching damage was introduced to the exposed back surface of the AlN-single-crystal substrate 10 by using a mixed gas of $CHF_3/H_2$ as the gas used.

Next, the produced semiconductor wafer 2 was attached to a supporting substrate 60, which was a sapphire substrate cut in accordance with the semiconductor wafer 2, using wax. The wax used is based on isopropyl alcohol (IPA). In a certain attachment condition, an appropriate amount of the wax was dropped on the element layer stacked surface side of the semi conductor wafer 2, and then was wetted and spread on the front surface by a spin coater. The sapphire substrate was then coated with a wax in a similar manner. Next, the sapphire substrate and the semiconductor wafer 2 were placed on a stage at 125° C. with the wax-coated surface facing up, and held for 45 seconds. Thereafter, the sapphire substrate and the semiconductor wafer 2 were taken down from the stage and sufficiently cooled, and then the wax-coated surface on the sapphire substrate and the coating surface of the semiconductor wafer 2 were superposed at room temperature. Next, the superposed sapphire substrate and semiconductor wafer 2 were placed on the stage at 125° C. again, and tracing paper and glass substrate were immediately put on in this order. A weight of 3 Kg was placed thereon and held thereon for 60 seconds, and then the weight and the stacked body of the sapphire substrate, semiconductor wafer 2, tracing paper and glass substrate were taken down from the stage. Then, the weight was placed again on the stacked body on the stage at room temperature and held for 30 seconds. Thereafter, the tracing paper and the quartz glass in contact with the –c-plane of the semiconductor wafer 2 were removed, whereby the semiconductor wafer 2 attached to the supporting substrate 60 was prepared.

(Chemical Etching Step)

Next, the semiconductor wafer 2 attached to the supporting substrate 60 was immersed in boiled ultrapure water for 30 minutes. Next, the semiconductor wafer 2 attached to the supporting substrate 60 was immersed in a 10% KOH (potassium hydroxide) aqueous solution held at 92° C. for 20 minutes, to perform chemical etching from the –c-plane of the AlN single crystal substrate 10. Thereafter, the semiconductor wafer 2 was peeled off from the supporting substrate 60 once, and the wax fixing step and the chemical etching step were repeatedly performed twice.

(Protective Layer/Wax Removing)

Next, the semiconductor wafer 2 attached to the supporting substrate 60 was immersed in an HF (hydrogen fluoride) solution for 15 minutes at room temperature, so that the protective film 50 was etched to remove the protective film from the back surface of the semiconductor wafer 2. Further, the semiconductor wafer 2 attached to the supporting substrate 60 was peeled off by IPA. The peeling was performed by heating the IPA on a stage at 70° C., immersing the semiconductor wafer 2 attached to the supporting substrate 60 for 10 minutes therein, and then performing ultrasonic cleaning. The wax was melted by IPA heat treatment and ultrasonic cleaning, and the semiconductor wafer 2 fixed by the wax was peeled off from the supporting substrate 60.

(Element Separation Step to Completion of Light-Emitting Element)

Next, the peeled and cleaned semiconductor wafer 2 was attached to a sheet, and the sheet was stretched while pressing a ball to cause cleavage, so that element separation was performed.

One lot of group III nitride light-emitting elements was produced by the above-described producing method. Since the element separation was achieved by chemical etching and cleavage, burning by laser was not observed in all the external shapes of the elements after element separation. A SEM observation photograph of an actual group III nitride semiconductor after element separation is shown in FIG. 3.

The obtained group III nitride semiconductor was flip-chip bonded onto a ceramic mount to complete a croup III nitride light-emitting element. When current injection was 20 mA, the obtained group III nitride light-emitting element had an emission wavelength of 262 nm similarly to Comparative Example 1 and a light output power of 1.7 times that of Comparative Example 1.

The area of the active layer 20 in each of the following Examples 2 to 4 and Comparative Examples 1 and 2 is the same as that in Example 1. This is to evaluate the light extraction efficiency by making the injection current density the same for any group III nitride light-emitting element 1 having any element shape.

Comparative Example 1

The shapes and sizes of the element layer stacked surface 11 and the back surface 12 opposite to the element layer stacked surface in the first embodiment were both changed to a rectangle, and as the size of one side, 650×750 μm (area: 494000 μm$^2$). The element separation method was performed using a general laser scribing method.

The yield of the external shape after the element separation was 0%, and when the external shape of the element separated was observed, burn marks by the laser were observed in all the elements. When current injection was 20 mA, the obtained group III nitride light-emitting element had an emission wavelength and a light output power of 262 nm. The light output powers in the examples were evaluated using the light output power at this time as a reference value.

Comparative Example 2

An element was produced by performing the same operation as that in Comparative Example 1 except that the composition ratio of the active layer in Comparative Example 1 was changed so that the emission wavelength became 300 nm. The yield of the external shape after the element separation was 0%, and when the external shape of the element separated was observed, burn marks by the laser were observed in all the elements. When current injection was 20 mA, the obtained group III nitride light-emitting element had an emission wavelength and a light output power of 304 nm. The light output powers in the examples were evaluated using the light output power at this time as a reference value.

Example 2

An element in Example 2 was produced by performing the same operation as that in Example 1 except that, in Example 1, the element layer stacked surface 11 was changed to a regular hexagon and the shape of the n-electrode in the element layer stacked surface 11 in the regular hexagon was changed to a dodecagon, the largest length 32 of the dodecagon was 63 μm (area 294970 μm$^2$), and the respective sides of the element layer stacked surface 11 in the regular hexagon and the protective layer 60 were disposed in accordance with the a-plane of the AlN-substrate. The diagonal line having the largest length S is 693 μm and the area thereof is 311770 μm$^2$ in the element layer stacked surface 11.

An actual SEM observation photograph of the group III nitride semiconductor 2 after element separation is shown in FIG. 5. Since the element separation was achieved by chemical etching and cleavage, burning by laser was not observed in the external shapes of the all elements after element separation. When current, injection was 20 mA, the obtained group III nitride light-emitting element had an emission wavelength of 262 run and a light output power of 1.8 times that of Comparative Example 1.

Example 3

An element was produced by performing the same operation as that in Example 1 except that the composition ratio of the active layer in Example 1 was changed so that the emission wavelength became 300 nm.

When current injection was 20 mA, the obtained group III nitride light-emitting element had an emission wavelength of 304 nm and a light output power of 2.1 times that of Comparative Example 2.

Example 4

An element was produced by performing the same operation as that in Example 1 except that, in Example 1, the shape of the element layer stacked surface 11 was a regular quadrangle having a side of 600 μm (area: 360000 μm$^2$) and the shape of the protective layer 60 had a diameter of 480 μm (area: 180360 μm$^2$).

Figure 11:
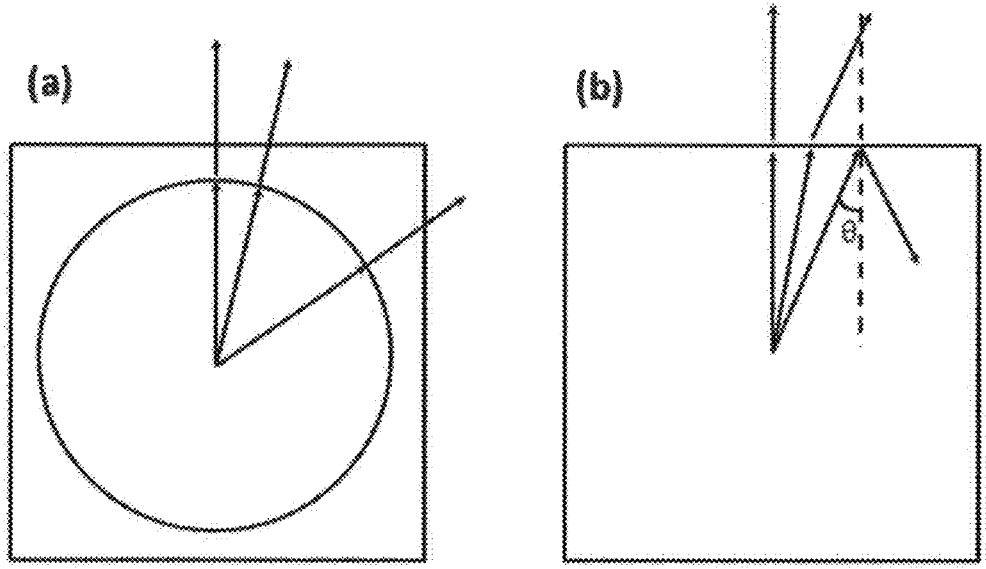
FIG. 11 is a bottom view for explaining an optical path through which light is extracted from the group III nitride light-emitting elements of the present invention (a) and the conventional art (b).

An actual SEM observation photograph of the group III nitride semiconductor 2 after element separation is shown in FIG. 6. Since the element separation was achieved by chemical etching and cleavage, burning by laser was not observed in the external shapes of the all elements after element separation. The obtained group III nitride light-emitting element, could not be measured due to poor bonding of the solder. However, the effect of the light extraction efficiency is considered to be the greatest. The reason will be explained with reference to FIGS. 11a and 11b. FIG. 11a is a bottom view illustrating an optical path through which light is extracted from the group III nitride light-emitting element of Example 3 in the present invention. FIG. 11b is a bottom view of a conventional group III nitride light-emitting element from which light is extracted. In a single crystal substrate having a large refractive index relative to air, light incident on the interface between the single crystal substrate and air is extracted to the outside of the group III nitride light-emitting element at an angle satisfying Snell's law. On the other hand, light incident at a low angle which does not satisfy Snell's law with respect to the normal line at the interface between the single crystal substrate and air, as shown in FIG. 11b, is reflected at the interface, remains inside the group III nitride light-emitting element, and is finally absorbed by the electrode surface and the element layer. However, in the case of the circular shape as in Example 3, since the normal line formed by the interface between the single crystal substrate and the air is always 0°, most of the light, is expected to be extracted. Therefore, it is considered as an ideal case that the light-emitting element can be produced in a circular shape or a shape having no corner when it is the frustum of the cone or the light-emitting element is sliced in parallel with the element layer stacked surface.

REFERENCE SIGNS LIST

1: group III nitride stacked body
10: substrate
11: c-plane
12: -c-plane
13: ridge line
14: side surface portion
20: element layer
21: n-type layer
22: active layer
23: p-type layer
24: n-type electrode
25: p-type electrode
26: overcoat layer
50: protective layer
60: supporting substrate

What is claimed is:

1. A group III nitride semiconductor light-emitting element comprising:
   a single crystal substrate; and
   an element layer including an n-type layer, an active layer, and a p-type layer formed on an upper surface of the single crystal substrate in this order and having a composition represented by a composition formula Al$_X$Ga$_Y$In$_{1-X-Y}$N (0≤X≤1.0, 0≤Y≤1.0, 0≤X+Y≤1.0),
   wherein:
   a thickness of the single crystal substrate is at least 80 μm,
   an area of the upper surface of the single crystal substrate is larger than an area of a bottom surface of the single crystal substrate, and
   a shape of the bottom surface of the single crystal substrate is a circle.

2. The group III nitride semiconductor light-emitting element according to claim 1, wherein an angle between a ridge line, defined by side surfaces of the single crystal substrate which are adjacent to each other, and the upper surface in the single crystal substrate is in a range of 35° to 75°.

3. The group III nitride semiconductor light-emitting element according to claim 2, wherein at least one part of the ridge line is a round surface.

4. The group III nitride semiconductor light-emitting element according to claim 1, wherein the single crystal substrate is a group III nitride single crystal substrate, and the upper surface is a +c-plane of the group III nitride single crystal substrate.

5. The group III nitride semiconductor light-emitting element according to claim 4, wherein the group III nitride single crystal substrate is an AlN substrate.

6. The group III nitride semiconductor light-emitting element according to claim 1, wherein an emission wavelength of the group III nitride semiconductor light-emitting element is in a range of from 200 to 365 nm.

7. The group III nitride semiconductor light-emitting element according to claim 1, wherein a shape of the upper surface of the single crystal substrate is selected from the group consisting of a triangle, a quadrangle, a hexagon, an octagon, a dodecagon, and a circle.

8. The group III nitride semiconductor light-emitting element according to claim 1, wherein a shape of the upper surface of the single crystal substrate is a circle or a regular polygon.

9. The group III nitride semiconductor light-emitting element according to claim 1, wherein a shape of the upper surface of the single crystal substrate is a circle.

10. A method for manufacturing a group III nitride semiconductor light-emitting element having an element layer on a single crystal substrate, comprising:
    a step of stacking the element layer including an n-type layer, an active layer, and a p-type layer formed on an upper surface of the single crystal substrate in this order and having a composition represented by a composition formula Al$_X$Ga$_Y$In$_{1-X-Y}$N (0≤X≤1.0, 0≤Y≤1.0, 0≤X+Y≤1.0),
    a step of forming a protective layer having an area smaller than an area of the upper surface on a bottom surface of the single crystal substrate, wherein a shape of the protective layer is a circle, and a step of chemical etching the bottom surface of the single crystal substrate.

11. A method for manufacturing a group III nitride semiconductor light-emitting element having an element layer on a single crystal substrate, comprising:

a step of stacking the element layer including an n-type layer, an active layer, and a p-type layer formed on an upper surface of the single crystal substrate in this order and having a composition represented by a composition formula $Al_XGa_YIn_{1-X-Y}N$ ($0 \leq X \leq 1.0$, $0 \leq Y \leq 1.0$, $0 \leq X+Y \leq 1.0$), a step of forming a protective layer having an area smaller than an area of the upper surface on a bottom surface of the single crystal substrate, wherein a shape of the protective layer is a circle, a step of dry etching the bottom surface of the single crystal substrate, and a step of chemical etching the bottom surface of the single crystal substrate.

12. The method according to claim 10, wherein the step of forming the protective layer is performed such that a center of the protective layer coincides with a center of the light-emitting element.

13. The method according to claim 10, further comprising a step of protecting a surface of element layer side of a group III nitride semiconductor wafer.

* * * * *